(12) United States Patent
Eliezer et al.

(10) Patent No.: US 8,659,457 B2
(45) Date of Patent: Feb. 25, 2014

(54) SELF-COMPENSATING DIGITAL-TO-ANALOG CONVERTER AND METHODS OF CALIBRATION AND OPERATION THEREOF

(71) Applicant: XW, LLC, Dallas, TX (US)

(72) Inventors: Oren E. Eliezer, Plano, TX (US); Ryan Lobo, Richardson, TX (US); Mark Appel, Plano, TX (US)

(73) Assignee: XW, LLC., Dallas, TX (US)

( * ) Notice: Subject to any disclaimer, the term of this patent is extended or adjusted under 35 U.S.C. 154(b) by 0 days.

(21) Appl. No.: 13/787,718

(22) Filed: Mar. 6, 2013

(65) Prior Publication Data

US 2013/0234871 A1 Sep. 12, 2013

Related U.S. Application Data

(60) Provisional application No. 61/607,446, filed on Mar. 6, 2012.

(51) Int. Cl.
*H03M 1/06* (2006.01)

(52) U.S. Cl.
USPC .......................................................... 341/120

(58) Field of Classification Search
USPC .......................................... 341/118–121, 144
See application file for complete search history.

(56) References Cited

U.S. PATENT DOCUMENTS

| | | | | |
|---|---|---|---|---|
| 4,272,760 A | * | 6/1981 | Prazak et al. | 341/120 |
| 4,835,535 A | * | 5/1989 | Shibayama et al. | 341/120 |
| 5,594,612 A | * | 1/1997 | Henrion | 341/120 |
| 6,501,405 B1 | * | 12/2002 | Zhang et al. | 341/143 |
| 2004/0208249 A1 | * | 10/2004 | Risbo et al. | 375/243 |

* cited by examiner

*Primary Examiner* — Howard Williams

(57) ABSTRACT

Cost-effective structures and methods that allow an integrated digital-to-analog converter (DAC) to simultaneously achieve wide dynamic ranges and bandwidths through the use of built-in measurement and compensation mechanisms that are primarily digital. The measurements of the DAC's distortions are made with a relatively simple analog-to-digital converter (ADC) that is not designed to accommodate the combination of the bandwidth and the resolution offered by the DAC, but is nonetheless sufficient in determining the characteristics of the DAC's impairments during a calibration procedure. This information is then used in a feed-forward compensation system during the DAC's normal operation to estimate and cancel the distortions in its output signal that could result from the various impairments.

30 Claims, 8 Drawing Sheets

SELF-COMPENSATING DIGITAL-TO-ANALOG CONVERTER AND METHODS OF CALIBRATION AND OPERATION THEREOF

CROSS-REFERENCE TO RELATED APPLICATION

This application claims the benefit of U.S. Provisional Application Ser. No. 61/607,446, filed by Eliezer on Mar. 6, 2012, entitled "Self-Calibrated Interleaved Digital-to-Analog Converter," commonly assigned with this application and incorporated herein by reference.

TECHNICAL FIELD

This application is directed, in general, to digital-to-analog converters (DACs) realized in integrated circuits (ICs), and, more specifically, to integrated wideband DACs and methods of calibrating and operating such DACs.

BACKGROUND

Wide bandwidth, high-resolution, low power, DACs are key building-blocks in communication systems, and particularly in software-defined-radios (SDRs), adaptive radar, instrumentation, and multimedia.

Although new fabrication process nodes are introduced at rates corresponding to Moore's Law, allowing ever-increasing miniaturization and reduction in cost and power consumption of high data-rate systems, the long-recognized fundamental limitations associated with device mismatches and fabrication-process variations remain a limiting factor in implementing high-precision analog circuits. These circuits typically necessitate costly production testing, which may involve calibration and compensation often involving laser trimming. Additionally, production yields are typically limited due to process variations, which further impact the cost of high precision wideband data converters. Further, with limitations associated with the design and "productization," wide bandwidth, high-resolution, low power DACs are not amenable to integration with extensively digital system-on-chip (SoC) solutions, which are typically realized in an advanced nanometer scale CMOS fabrication process and are becoming increasingly popular in high-volume consumer market products. This inhibits not only the miniaturization, which is of importance particularly in portable products, but also the ultimate cost reduction that is so desirable in all markets.

SUMMARY

One aspect provides a self-calibrating DAC. In one embodiment, the DAC includes: (1) at least one DAC core operable to receive data pulses and clock pulses and produce an output having at least one impairment, (2) an analog function block coupled to the at least one DAC core and operable to receive and make measurements of the at least one impairment, (3) an analog-to-digital converter (ADC) coupled to the analog function block and operable to digitize the measurements and (4) a digital controller coupled to the at least one DAC core and the ADC and operable to employ the measurements to compensate at least one of the data pulses and the clock pulses and attenuate the at least one impairment.

Another aspect provides a method of calibrating a DAC. In one embodiment, the method includes: (1) intermittently coupling a tested element to an input of the DAC, (2) operating the DAC to produce an output signal, (3) using an ADC to determine static amplitude errors in the output signal caused by a presence of the tested element and (4) using the ADC to determine dynamic amplitude errors in the output signal caused by the intermittently coupling of the tested element.

Yet another aspect provides a self-calibrating method for a DAC. In one embodiment, the method includes: (1) determining a partition for correction of instantaneous error among digital amplitude, analog amplitude and pulse duration and timing paths, (2) applying a corresponding digital amplitude correction via a summer, (3) applying a corresponding digital amplitude correction via the DAC and (4) adjusting the pulse duration and timing paths in accordance with a remainder of a predicted error.

BRIEF DESCRIPTION

Reference is now made to the following descriptions taken in conjunction with the accompanying drawings, in which.

DETAILED DESCRIPTION

Figure 1:
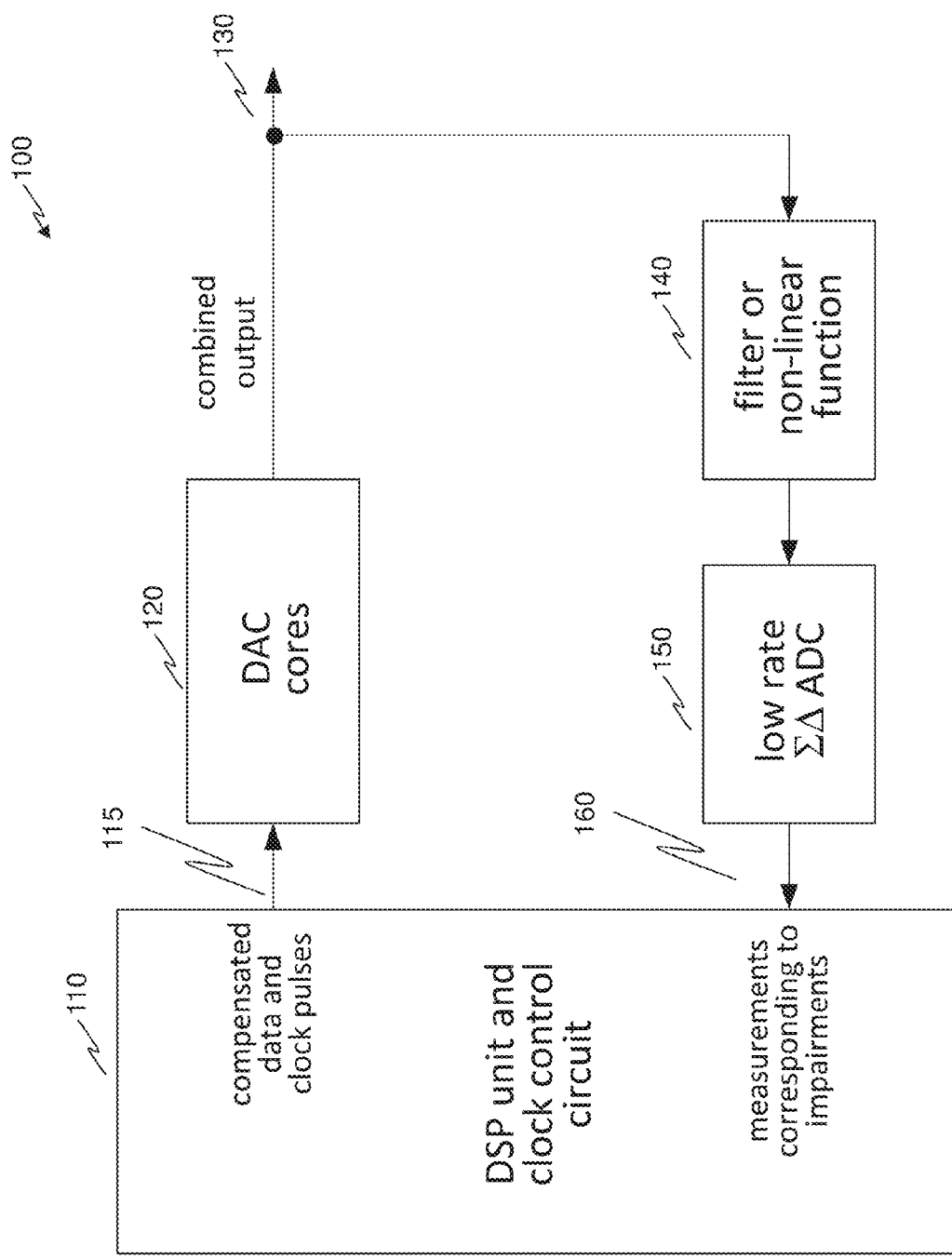
FIG. 1 is a high-level block diagram of one embodiment of a self-compensated DAC.

As stated above, wide bandwidth, high-resolution, low power DACs are not amenable to integration with extensively digital SoC solutions, which are typically realized in an advanced nanometer scale CMOS fabrication process and are becoming increasingly popular in high-volume consumer market products. This inhibits not only the miniaturization, which is of importance particularly in portable products, but also the ultimate cost reduction that is so desirable in all markets.

However, it is realized herein that the increasing gate densities and levels of integration of advanced CMOS processes do allow high-complexity and high-speed digital mechanisms for self-calibration and self-compensation, and these mechanisms can be employed to alleviate the various inevitable impairments experienced in the analog circuitry. Hence, various embodiments of a self-compensating DAC and method of operation thereof introduced herein use digital resources, such as digital processing power and memory, which become more readily available at reduced silicon area, cost, and power consumption, as the fabrication processes continue to scale down in accordance with Moore's Law. The digital resources serve to compensate dynamically for the inevitable non-idealities in the analog circuitry of the DAC's core and for the distortions experienced in it as a result of these impairments. Certain embodiments provide novel and useful cost-effective structures and methods that allow an integrated DAC to achieve wide bandwidths and dynamic ranges (i.e. fine resolution) at low production costs.

Certain of the self-calibrated DAC and method embodiments rely on self-sufficient characterization of the non-idealities for which the built-in compensation mechanisms offer a relief. Accordingly, two are realized internally in the DAC IC. These include a way to self-measure the DAC's impairments with sufficient accuracy, as well as a way to apply the necessary correction at a given instance based on a predicted distortion that would otherwise be experienced at the output of the DAC. In the certain embodiments, the self-measurement and compensation are both accurate to meet the accuracy/dynamic-range requirements of the DAC and fast to meet the bandwidth requirements of the DAC, which dictate its high clocking rate.

In one embodiment, the DAC's core is based on a single DAC, i.e. a single conversion array, which may be realized by a prior art current-steering structure. In another embodiment, the DAC is based on multiple DACs that operate in a time-interleaved fashion. Interleaved DACs (lacking the novel self-compensating circuits introduced herein) are described in, e.g., Balasubramanian, et al., "Systematic Analysis of Interleaved Digital to Analog Converters", IEEE Transactions on Circuits and Systems—II: Express Briefs, Vol. 58, No. 12, December 2011, incorporated herein by reference. Balasubramanian teaches an interleaved DAC constructed of four identical cores, each of which operates at one quarter of the update rate that is achieved at the output of the combined structure, where the currents from all four DACs are summed.

In another embodiment, the multiple interleaved branches comprising the wideband DAC operate at different rates, have different resolutions, or are operated differently in other ways. These differences are accounted for as the digital processing unit at the heart of the wideband DAC distributes the digital data between the different DACs to synthesize the desired signal at its output. Thus, the combined operation of the multiple branches meets the specific desired requirements, while each of the individual DACs is designed to meet different performance targets.

In one embodiment, the compensation method involves either time-domain manipulations of the digital signals that are applied to the input signal of the multiple DAC branches. In another embodiment, the compensation method involves digitally-controlled current/voltage based corrections. In yet another embodiment, the compensation method involves a combination of both time-domain manipulations and digitally-controlled current/voltage based corrections.

In one embodiment, the time-domain manipulations include the adjustment of the instances at which particular digital words are applied to specific element in the converter (e.g., a word applied to one of the branches in an interleaved structure, or an activating pulse that is applied to a current source in a current steering DAC). In another embodiment, the time-domain manipulations include the adjustment of the duration of a pulse that determines how long a certain corresponding current/voltage would be produced by a conversion element. In yet another embodiment, the time-domain manipulations include both the adjustment of the instances at which particular digital words are applied to specific elements in the converter and the duration of a pulse that determines how long a certain corresponding current/voltage would be produced by a conversion element.

In various embodiments, the effects of the impairments are mitigated by applying an inverted estimated error signal, such that attenuation, and perhaps effective cancellation, of a predicted error is achieved. In one embodiment, this is performed after combining the time-domain manipulations as described above. In an alternative embodiment, this is performed before combining time-domain manipulations, such that the processing unit, which is responsible for determining the necessary error that is to be compensated for at every instance, may distribute the correction between the uncombined manipulations.

Certain of the embodiments disclosed herein are employable in one or more of the following applications:

1) Data Over Cable System Interface Specification (DOCIS) head-end transmitters: software reconfigurable coax transmitters that can operate in a range from 50 MHz to 1 GHz.

2) Multimedia Over Cable Alliance (MOCA) transmitters: MOCA transmitters provide an in-house media distribution solution that operates over 50 MHz, 100 MHz and 200 MHz bandwidths at center frequencies between 1.1 GHz and 1.7 GHz.

3) Cognitive radio transceivers: Cognitive radio transceivers use empty spaces in the spectrum normally licensed to other users, and adaptively select a frequency of operation and a bandwidth based on availability. Due to their possible use of a wide range of carrier frequencies, possibly with multiple simultaneous carriers carrying various wide bandwidths, they may benefit from the use of the wideband DAC of the present invention.

4) Waveform Generators: Instrumentation designed for certain applications requiring the generation of arbitrary waveforms potentially having demanding bandwidth and accuracy requirements.

5) Adaptive Radar: Adaptive radars employ various wideband signals, beyond simple pulses, that may span over a wide range of frequencies representing a high relative bandwidth (ratio between bandwidth and center frequency).

6) Software-Defined Jammers: Jammers likewise require the generation of arbitrary waveforms potentially spanning a wide frequency range and requiring simultaneous coverage of it, rather than a simply sweep that is narrowband at any given instance.

7) Wireless Base Stations—Such base stations exist in 4G and LTE networks, among others, and may require carrier-aggregation, wherein carrier frequencies from distant bands are to be generated simultaneously. Such system can benefit from the DAC of the present invention, as it may serve to replace the multiple signal-generation paths used in prior art solutions to allow carrier-aggregation that spans distant frequency bands.

8) Wireless LANs—Wireless LANs can employ certain of the embodiments described herein in the nodes thereof, where signals of wide bandwidths are to be accommodated and spectral purity, requiring a low level of distortions, is of interest.

FIG. 1 provides a high-level block diagram illustrating the general structure of the self-calibrated DAC 100. The DAC 100 comprises a digital signal processing (DSP) unit 110, where the digital signal originates and various digital computation and storage operations are performed, a DAC 120, which may be based on either a single DAC core or multiple DACs that operate in a coordinated fashion to produce an analog signal 130 that is based on digital stimuli 115, a filter or non-linear function 140 used to process the output signal 130 to characterize the impairments of interest, for which the DSP 110 will establish the appropriate compensation, and an analog-to-digital converter (ADC) 150, which converts the measurements into digital information 160 that the DSP is capable of reading and processing.

The ADC 150 is required to accommodate fine enough resolution to identify the impairments of interest in the signal 130, but may be based on a relatively low-rate high-resolution sigma-delta modulator, which is not required to accommodate the bandwidth targeted by the DAC 100. The static amplitude impairments originating from mismatches between current sources in the DAC core/cores 120 may be evaluated by using relatively low rate stimuli 115, which would activate and deactivate a tested current source in 120 alternately while the resultant difference in the output signal 130 is evaluated using simple low rate measurements in ADC 150, without requiring any filter or non-linear function 140.

The results of these measurements, pertaining to the static impairments, are then stored in tables in the DSP 110, to be referred to by the digital compensation algorithms.

It is to be noted that inaccuracies in gain/amplitude related parameters, such as the magnitudes of currents in elements of a steering DAC, would be manifested in dc measurements that can be obtained in the fashion described above, wherein a relatively low rate of toggling and measurement would be sufficient to establish the magnitude of the impairment of interest. One example for such impairment is the natural mismatch that may be experienced between two nominally-identical branches in a unary array, or a ratio error in a binary array, wherein the ideal ratio between branches is $\alpha_{ideal}=2^N$, where N is an integer, and the actual ratio may be $\alpha_{actual}=2^N+e$, where e represents a positive or negative error. Another example for such impairment may be a gain error or mismatch between two branches in an interleaved DAC, requiring either analog compensation to be applied in the analog domain, or digital compensation, which is based on digital attenuation/amplification that is applied to the appropriate branch so as to reach the desired gain relationships between the multiple braches.

Contrary to this type of static gain errors, dynamic errors, that may be observed only when high frequency operation is involved, may not be characterized in such manner, i.e. through the use of digital stimuli that varies at a low rate.

The characterization of dynamic effects, such as switching glitches, as well as differences in capacitances between elements in an array or between branches in an interleaved DAC, represent a much greater challenge, since they are frequency-dependent distortions, for which simple low frequency measurements are inadequate.

A novel measurement method for such dynamic effects involves the high-rate activation/deactivation of the circuitry being evaluated, while a detection circuit, realized in the filter or non-linear function 140 and essentially serving to convert the high frequency energy to low frequencies, precedes the low-frequency measurement performed in the ADC 150.

In one embodiment, the filter or non-linear function 140 is a low pass filter that evaluates the dc level in a square wave that is generated by the on/off toggling of a current source under test. The transients in the switching of the current source may affect the average (dc) value that would be produced in the fast-toggling signal when compared to its value when the switching rate is significantly reduced (i.e. when the effect of the transients is negligible). Thus, such measurement/evaluation mechanism, while being based on relatively simple and low-cost circuitry, employing proxies for the evaluation of the dynamic impairments of interest, allows the DAC 100 to characterize its impairments self-sufficiently without necessitating explicit measurements of the performance parameters specified for the wide bandwidth operation of the DAC.

Figure 2:
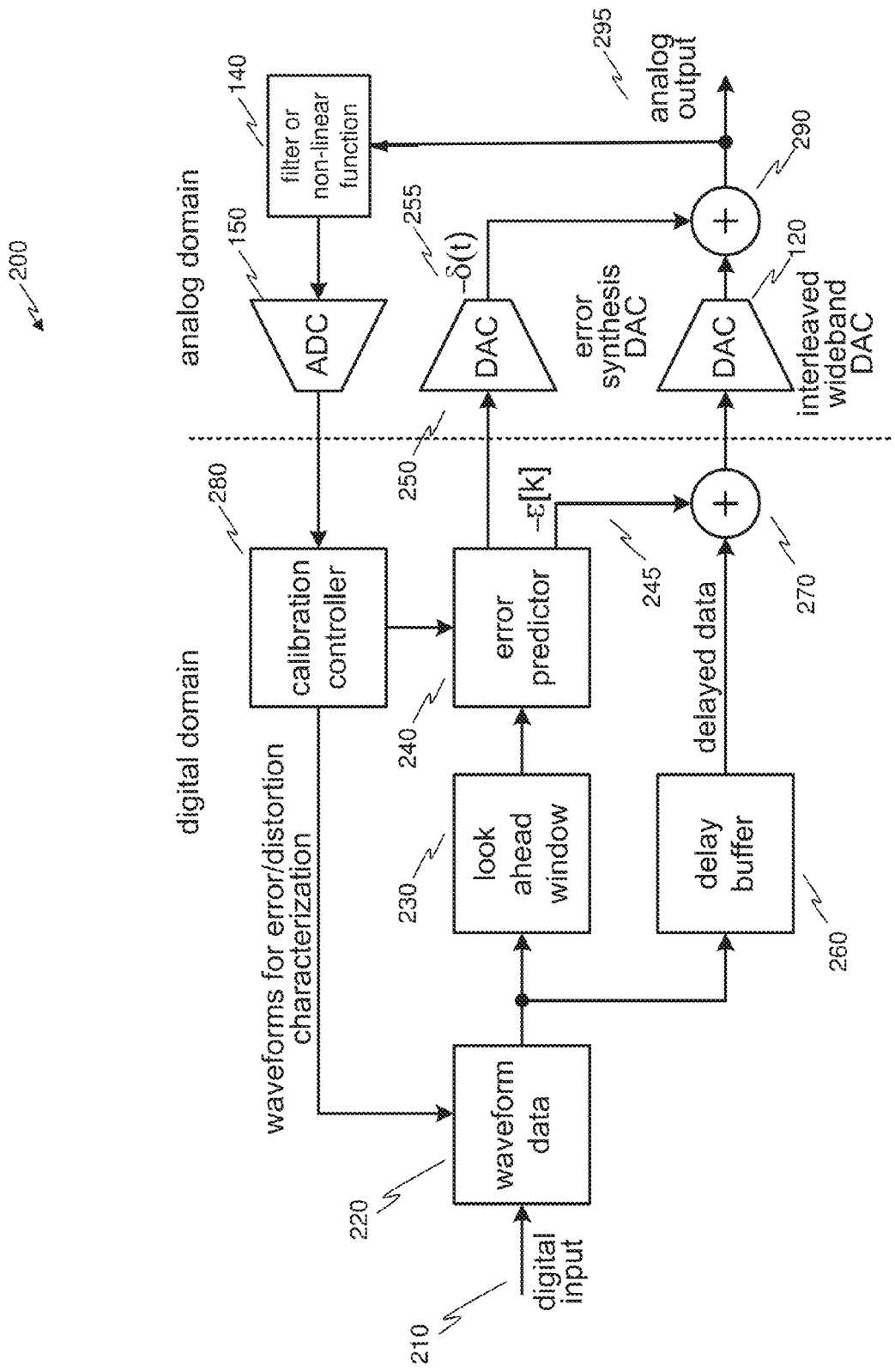
FIG. 2 is a block diagram detailing the calibration and compensation functions of the self-calibrated DAC of FIG. 1.

FIG. 2 provides a more detailed block diagram for an example embodiment 200 of the DAC 100, wherein various functions are shown to comprise the DSP in a "digital domain" of FIG. 2. The calibration method may be considered a training operation that serves for calibration prior to transitioning into normal operation mode, wherein the DAC 100 must meet its targeted bandwidth and dynamic range. The calibration operation may also be repeated periodically, to maintain adequate accuracy in the presence of temperature variations or other factors that might affect the distortions of interest.

FIG. 2 illustrates a hybrid compensation system 200 where the wideband DAC is aided both by a dedicated error DAC 250, which applies an analog cancellation signal $-\delta(t)$ 255 intended to cancel an estimated error $\delta(t)$, as well as by a correction word $-\epsilon[k]$ 245 in the digital domain.

The combined effect of the continuous time $-\delta(t)$ and discrete time $-\epsilon[k]$ error-estimate signals is intended to provide sufficient cancellation of the predicted DAC error in a feed-forward manner, such that the desired performance criteria would be met. These two signals are controlled by error predictor 240, capable of estimating the distortion that is to be experienced at every instance based on prior calibration and on the use of a lookahead window 230, which is a memory buffer containing an interval of the digital signal to be synthesized.

Principle of Built-in Calibration

The illustrated embodiment of the error predictor 240 is fed by multiple data samples, made available to it by the lookahead-window buffer 230, representing an interval of the waveform that is to be synthesized by the wideband DAC. In the illustrated embodiment, the window width is selected such that it is wide enough with respect to the impairments' time constants and the corresponding bandwidth of the core of DAC 120, such that all history, which may be relevant to the distortion that is predicted for a given instance, is made available to the predictor 240. A delay buffer 260, representing in the illustrated embodiment a greater delay than the interval stored in the lookahead window, serves to equalize the paths from a timing perspective, while accounting for processing time in the error predictor 240.

It is to be noted that a considerable amount of computation may be required in the predictor 240, not all of which may be linear. However, various conventional parallel and pipelined architectures may serve to achieve a desired low latency, while the structure of DAC 200 only requires that the delay buffer 260 be adjusted such that the delayed data provided to a digital summer 270 be aligned with the estimated error 245. Typically, in the applications for which the wideband DAC 200 is intended, some latency in producing the analog output 295, with respect to the digital input 210, may be allowed, while the demanding requirement is on the rate of the data samples, which dictates the system's bandwidth. Since the latency and rate are unrelated, and the information regarding "future" samples of the signals can be made available, the predictor essentially performs what may appear as a non-causal operation. Hence, even relatively high levels of complexity may be affordable, which result in ever decreasing silicon area and power consumption as technology advances to denser geometries, representing an important advantage when considered for implementation in highly complex digital system-on-chip (SoC) integrated circuits.

It is interesting to note that if the compensation of ADC (rather than DAC) distortions were to be targeted, it would not be practical to assume that the ADC could have multiple input samples available to it for digital processing ahead of each conversion instance, whereas in the case of a DAC it is safe to assume that many consecutive samples of the desired waveform to be synthesized may be made available for processing, as is exploited herein.

The built-in measurements of the distortions of interest are performed by ADC 150 and a filter or non-linear function 140, which monitor the output signal while specific training waveforms, generated by waveform generator 220, according to data provided by calibration controller 280, are used to reveal specific distortions/errors of interest in DAC 120. In the illustrated embodiment, these waveforms are based on square-wave toggling between two specific code words, such that specific targeted current sources in the current-steering wideband DAC cores would be stimulated. However, other waveforms may be designed and used for other types of distortions. In the illustrated embodiment, the calibration controller 280 dictates the waveform to be used at a given moment and reads the resultant measurement from ADC 150. These readings, after their appropriate processing, are used to determine how the error predictor is to respond for specific sequences of samples, for which a related distortion is to be expected.

Dynamic Timing Adjustment (DTA) to Compensate for Dynamic Integrated Non-Linearity (INL)

In another embodiment, which may be considered as a special case of the general structure described above, the DAC's INL is compensated for through time-shifting rather than by means of adding estimated errors in the analog and/or digital domains. This method, to be referred to as DTA, is based on the retiming (i.e. advancing or delaying) of individual clock edges that determine the timing at which a digital word in applied to a particular array in the DAC 120. In the illustrated embodiment, these timing adjustments are based on predicted amplitude errors and on the calculated slope of the waveform being synthesized. Accordingly, the lookahead data buffer 230, holding multiple consecutive DAC words, is used in the computation of the signal's trend. Based on the predicted errors for each sample, and on the signal's trend around that sample, a timing-correction function, employing a digitally-controlled delay block, adjusts the timing of the clock pulse edge for that sample by either advancing or delaying it slightly (the assumption is that the error to be corrected is relatively small and that the signal bandwidth is high, such that the slope is not flat between most consecutive samples).

Figure 3:
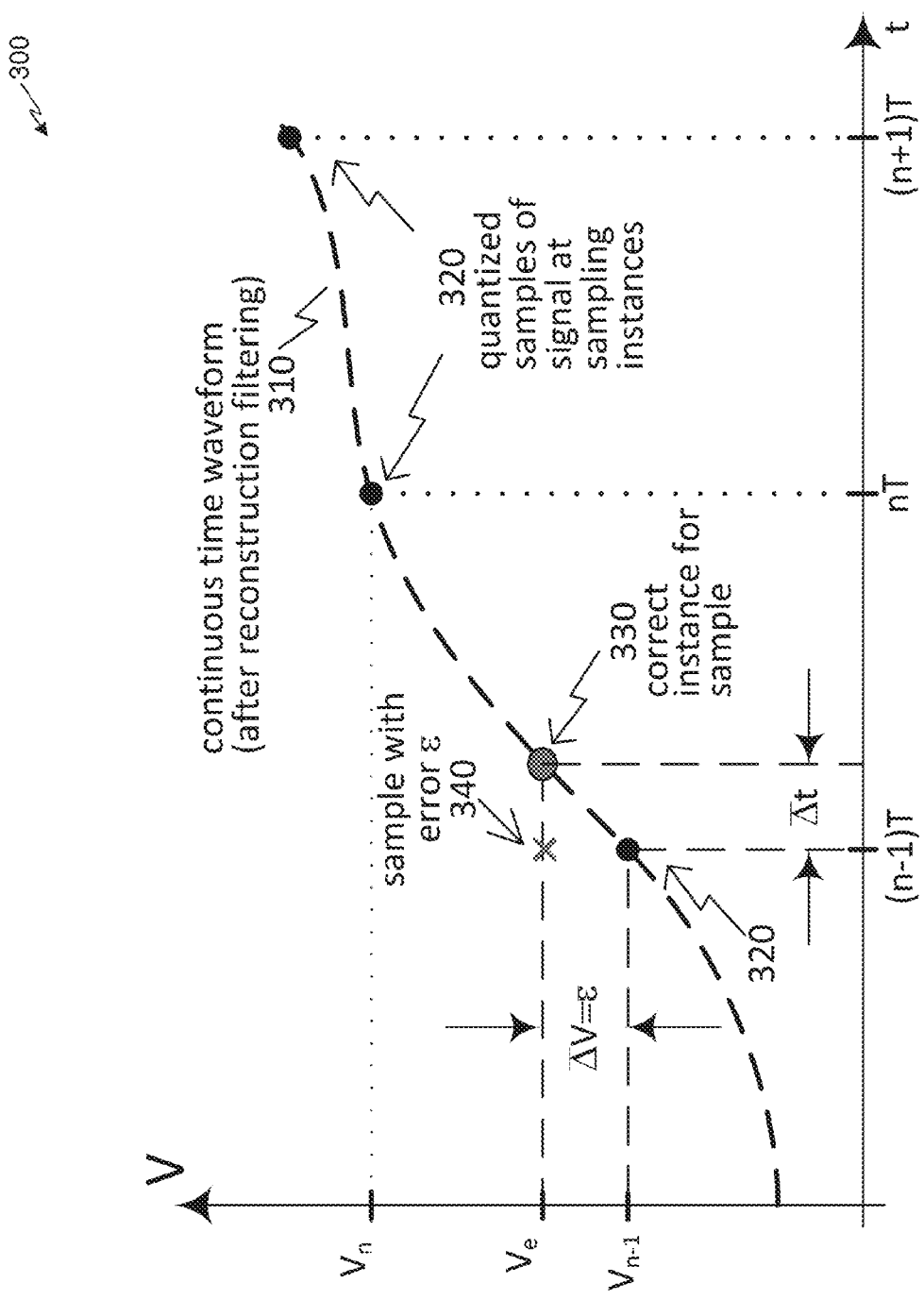
FIG. 3 is a time-domain waveform illustrating a time-domain based compensation method undertaken in the self-calibrated DAC of FIG. 1.

FIG. 3 illustrates this technique on a time-domain waveform representing the output of DAC 100, where a sample 340, shown as "x," experiences a predicted positive instantaneous error $\epsilon$ at a given instance (n−1)T. In this example, where the signal is shown to have a positive slope around sample 340, a delay of $\Delta t$ in producing that sample is shown to allow the DAC's output to coincide with the desired reconstructed waveform at point 330, thereby eliminating the error $\Delta V-\epsilon$. This is the result of effectively introducing, via the reconstruction interpolating filter at the output of the DAC, a negative correction $-\epsilon$ at the sampling instance (n−1)T being addressed. If the predicted error were negative, the clock transition for that sample would be adjusted to occur correspondingly earlier, such that the correction introduced at sampling instance (n−1)T would be positive. In either case, the DSP serving for error prediction, having knowledge of the upcoming samples (and hence the trend) of the synthesized waveform, can modify the timing (introduce a $\Delta t$) for each output-update instance to compensate for both positive and negative amplitude errors that could occur at that instance, using simple linear-interpolation.

Further, the DSP may have a digitally interpolated form of the synthesized waveform available to it, allowing it to more accurately determine the signal's slope around each instance, rather than relying on linear approximations that are calculated at the clock rate $f_{clk}$, which is used for the synthesis in each core in an interleaved DAC.

In fact, the DSP in an interleaved DAC having four branches, for example, would provide samples at a rate of $f_n=4\times f_{clk}$, allowing the trend of the signal to be determined more accurately around each clock instance for each of the DAC cores, since $T=T_s<T_{clk}$.

The prediction of the DAC error $\epsilon$ for a given instance considers both the static effects associated with the DAC word being produced, as well as the dynamic effects such as glitches. Depending on the magnitude of the error being corrected, it is also possible for the DSP to increment/decrement the output word (i.e. to digitally predistort), particularly whenever this involves only the addition or removal of unary bits (i.e. no carry/borrow is created in the addition/subtraction operation).

Sinc Response Compensation Combined with Gain Compensation

Figure 4A:
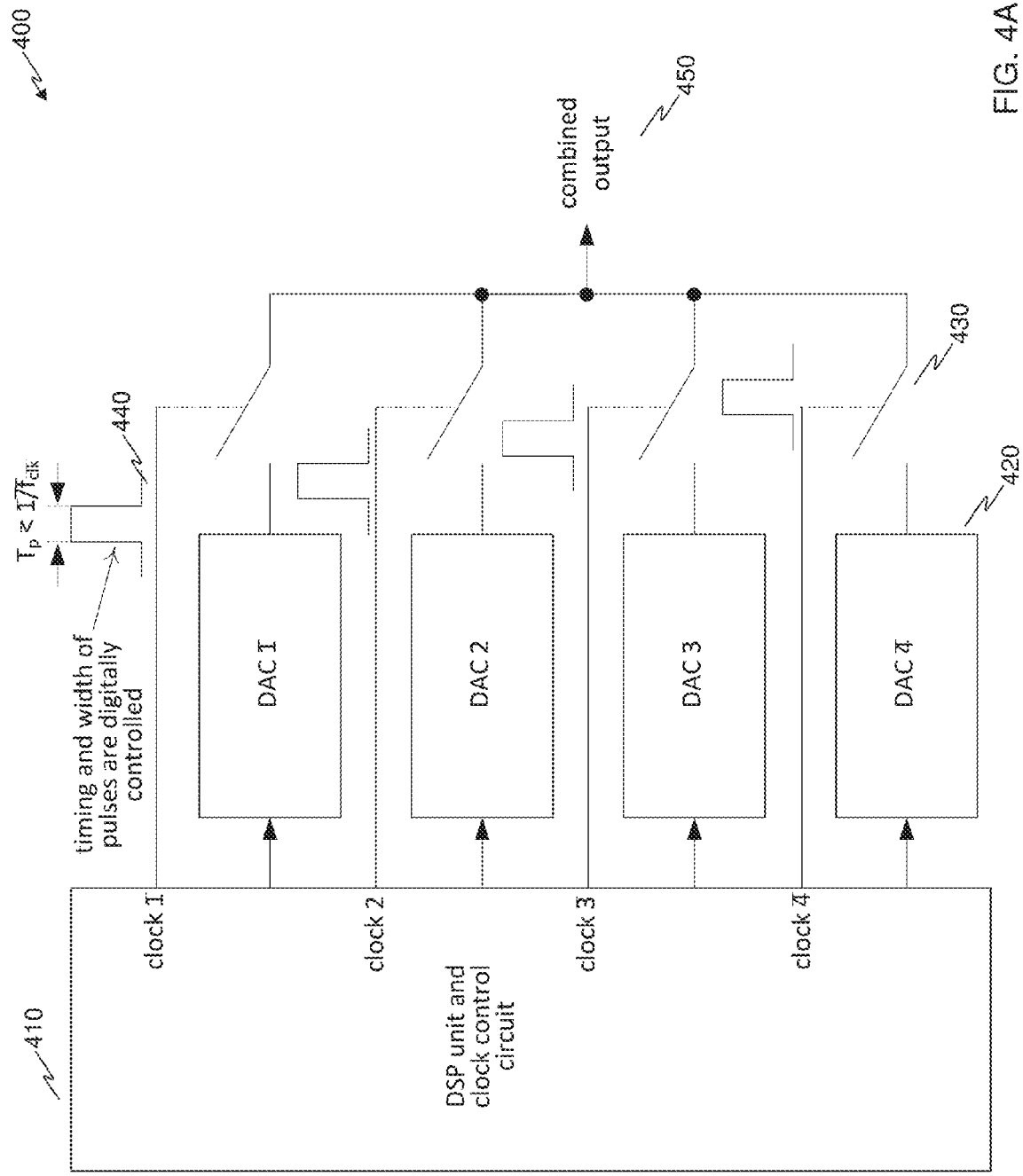
FIG. 4A is a block diagram illustrating the coordinated operation of multiple branches in an interleaved DAC incorporating time-domain based compensation.
Figure 4B:
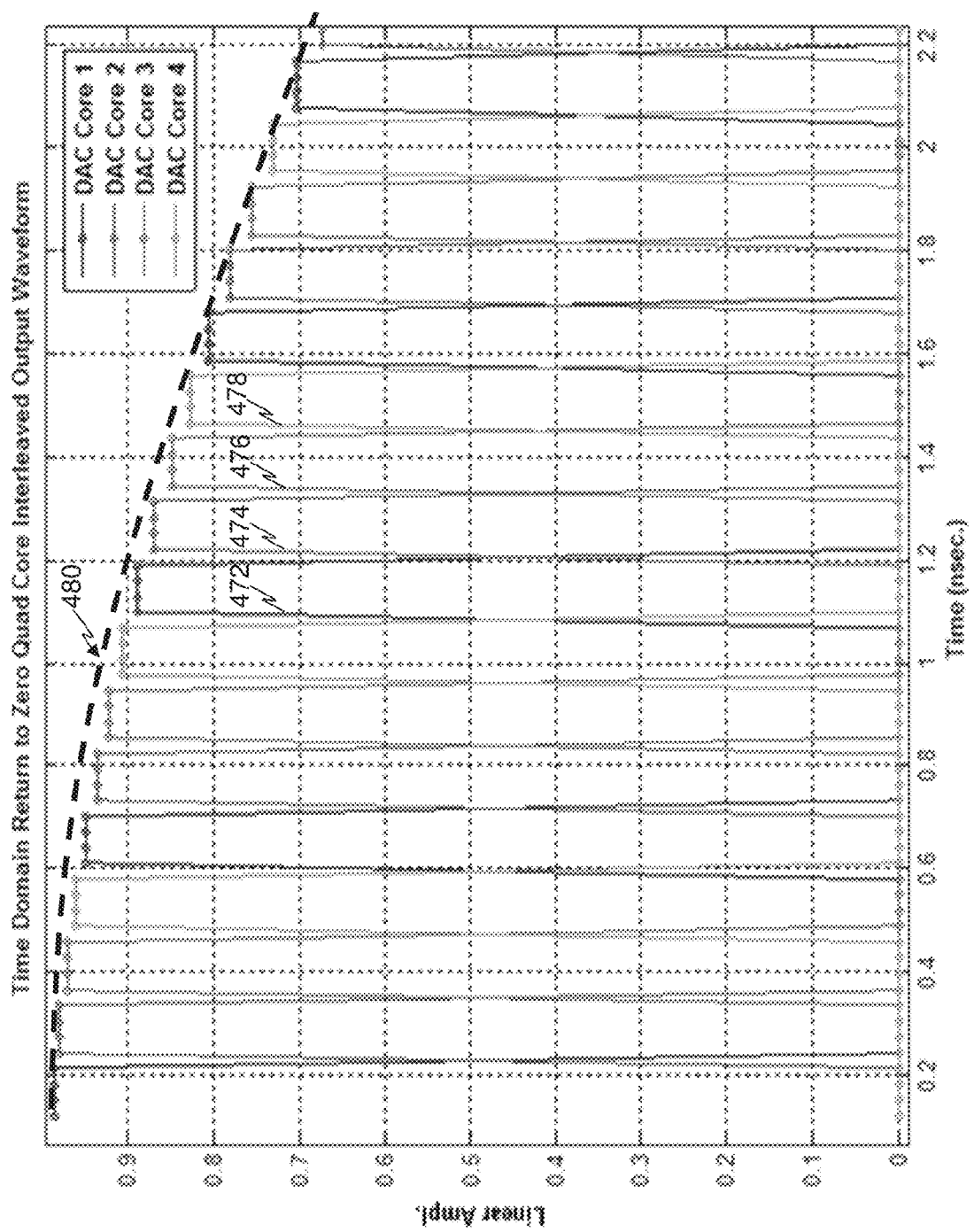
FIG. 4B illustrates time-domain waveforms from multiple DAC branches and their combined signal that is produced at the output of the DAC of FIG. 1.

FIG. 4A provides a high level block diagram illustrating an additional compensation mechanism 400 that is targeted at correcting for the sinc response experienced at the output of each of the branches of an interleaved DAC (i.e. the nulls at integer multiples of $f_{clk}$ resulting from the zero-order-hold), as well as for gain mismatches between branches. The zero-order-hold (ZOH) operation that is inherent to the operation of a practical DAC has an impulse response that is a rectangular pulse in the time domain or a sinc function in the frequency domain, where a first null may be seen at $f_{clk}$, or the update rate of one branch/core of the converter. This response causes a loss of signal amplitude of 4 dB at the Nyquist frequency of the DAC and infinite loss at the update rate of each core of the DAC. The signal power lost in these nulls cannot be recovered, which inhibits the use of such DAC in applications where continuous frequency coverage is required. To effectively address this problem, the method described herein includes a step of reshaping the holding function at the output of each DAC 420 by sampling the output of each of the cores with an analog multiplexer (mux) 430 driven by a pulse 440 that is narrower than $1/f_{clk}$, thus creating a return-to-zero waveform at each of these outputs, as shown in FIG. 4B. The interpolated waveform 480, produced by the reconstruction filter at the output of DAC 100, would reliably follow the desired waveform that is to be synthesized, while eliminating the nulls associated with the wider pulse widths (i.e. extended hold times). The sinc response compensation system, based on the adjustment of the holding pulses 440, is combined with gain adjustment, being based on the fine control of the timing and duration of the pulses sampling the outputs of the multiple DAC cores. These pulses are used to control the analog multiplexing function 430 that combines the outputs of the multiple branches into a merged output signal 480 at node 450 (node 130 in FIG. 1). This combined output is the sum of signals 472, 474, 476, 478 produced by DAC cores 1, 2, 3, and 4 respectively, in a four-core interleaved DAC. Each of these signals is shown to have a hold time that is slightly shorter than ¼ of the clock cycle for each of the cores (or equal to the effective sampling period of the combined DAC), such the null of the sinc function associated with this pulse is placed at the sampling rate $f_s=4\times f_{clk}$ instead of at the clock rate $f_{clk}$.

A drawback to this approach is that it comes at the expense of loss in output power, for which gain compensation may be required. If, for example, in an interleaved DAC operating with four branches of rate $f_{clk}=2$ GHz ($f_s=8$ GHz) the resampling at the output of each 2 GHz branch core were to be based on pulses of width 125 ps (corresponding to 8 GHz), the nulls would be shifted up to 8 GHz, well beyond the 4 GHz Nyquist bandwidth, while introducing a loss of 6 dB in signal power.

Figure 5:
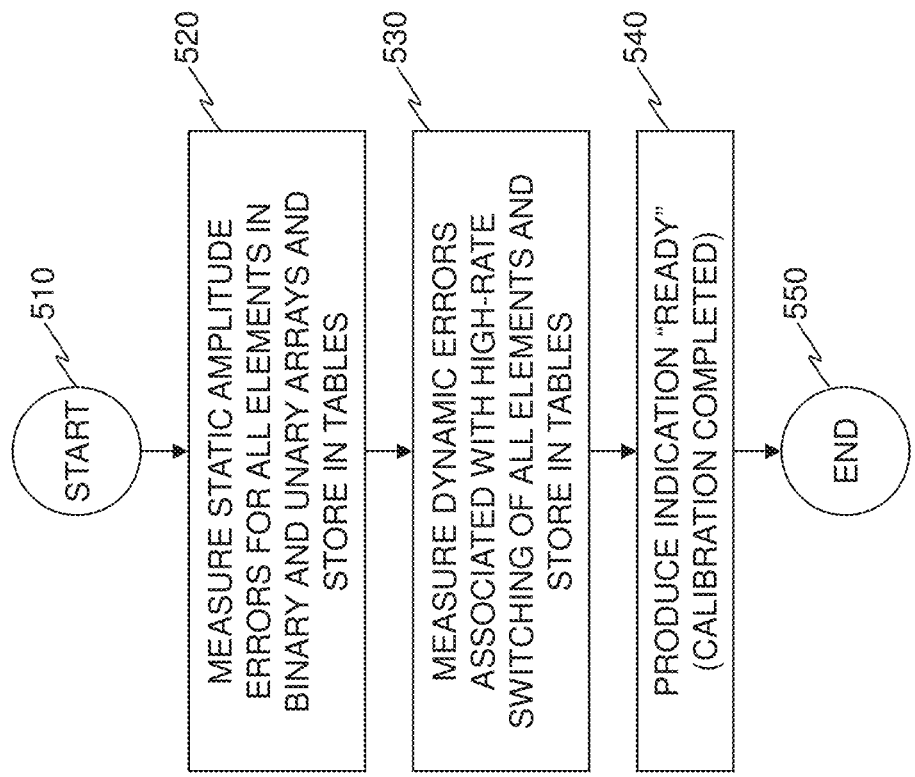
FIG. 5 is a high-level flow diagram of one embodiment of a method of calibrating a self-compensated DAC.

FIG. 5 provides a simplified flow diagram for one embodiment of a method of calibrating a self-compensated DAC. The method starts in a step 510, reached when the data converter is powered up or reset or whenever a periodic calibration is required. Such re-calibration may be required as a result of temperature variations that may have been experienced since the last calibration. Alternatively, calibration tables may include information pertaining to temperature dependencies, allowing temperature adaptation based on simple temperature measurement, rather than having to repeat the entire characterization of errors in the DAC. The first step 520 in the calibration method targets the characterization of the static amplitude errors, which may be accomplished by toggling a tested element at a low rate while the high-resolution slow ADC 150 is used to accurately determine the actual contribution made to the output signal (295 of FIG. 2) by the tested element. These contributions are stored in rewritable memory and are used during the real-time calculation of predicted errors and corresponding compensation that takes place during the DAC's normal operation of analog signal synthesis.

In a step 530, the characterization of the dynamic errors resulting from phenomena such as transients/glitches and variances in capacitances is targeted. These capacitances may not affect the static errors, since they would be fully charged or discharged in the steady state, i.e. for sufficiently slow signals, but could contribute errors during fast switching, when the DAC is used to generate wide-bandwidth signals. Therefore, step 530 is used to determine the dynamic effects experienced in each element of a DAC by creating a high-rate signal that is used to activate/deactivate the element being tested.

In one embodiment of the calibration method, the effect of each such capacitance may be approximated as a first order filter, for which a time-constant or equivalent corner frequency is to be established through measurement. By applying a combination of filtering functions, with possible inclusion of non-linear detection functions in 140, such as envelope detection, the calibration method is capable of determining the equivalent time-constant for a given element. In a step 540, a "ready" flag may be set, indicating that normal operation may be undertaken. The method ends in an end step 550.

Figure 6:
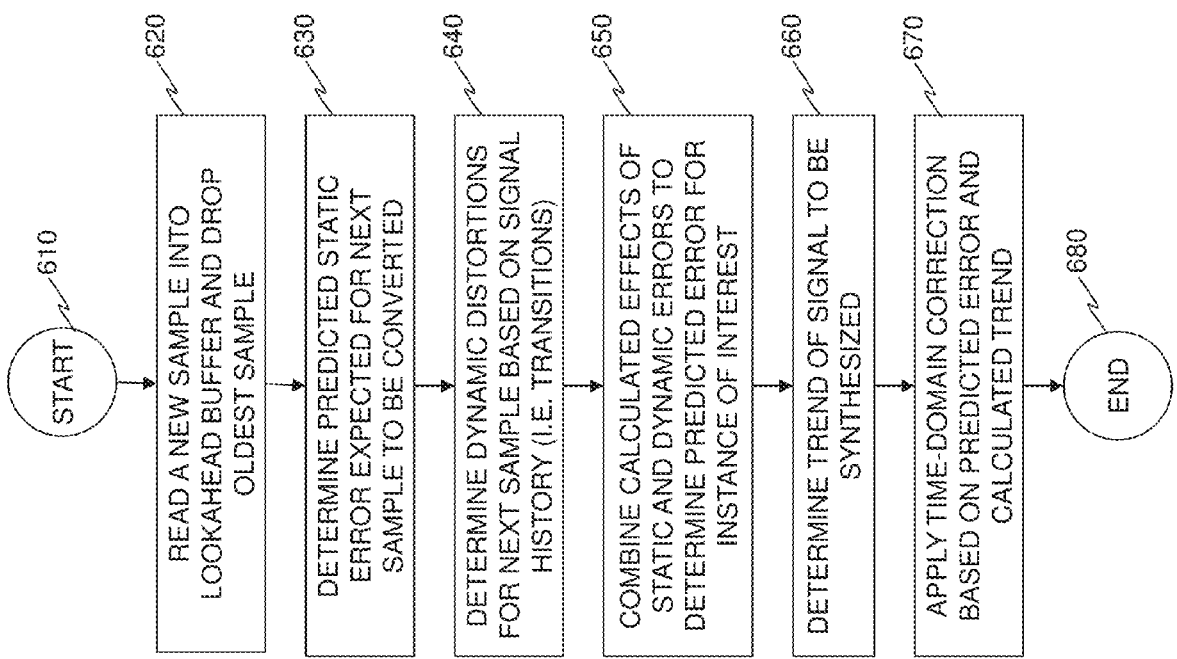
FIG. 6 is a flow diagram of one embodiment of a compensation method for a self-compensated DAC.

FIG. 6 provides a flow diagram for the sequence of operations that is carried out during normal operation, to realize the built-in dynamic compensation, in one embodiment of the DAC of the present invention. The method, starting in a step 610, is, in the illustrated embodiment, completed in one clock cycle, representing one sampling period $T_s$. In an alternative embodiment, the method is carried out over multiple clock cycles relying on a pipelined structure to ensure that the throughput of the calculations meets the necessary clock rate for the DAC.

In a first step 620 a new digital word, representing a sample that is to be converted in a corresponding analog output current or voltage, is fed into the first-in-first-out (FIFO) buffer (230 of FIG. 2), which is used as a lookahead window.

Based on a number of samples that are stored in the lookahead buffer, to be denoted Ns, both the static and dynamic errors to be anticipated are predicted for the sample to be converted to an analog current or voltage. The calculation may involve all Ns samples in the buffer or may be limited to a portion of them, depending on the dynamic effects that are to be considered. The static errors, by definition, are computed based only on the current sample being converted. If the various elements or branches involved in the conversion in the DAC are summed without interacting with one another, i.e. if sufficient isolation is implemented between them, the superposition principle will hold valid, allowing the predicted error to be calculated as the sum of the errors that would result from each of the components individually. For example, if a certain 8-bit digital word that is to be converted requires both the most-significant-bit (MSB) and the least-significant-bit (LSB) in a binary array to be activated, i.e. for the value 10000001, the predicted error may be calculated as the sum of the errors that were separately measured during the calibration step for the MSB and for the LSB individually (in this example the errors are assumed to be established with respect to a reference element in a unary array within a segmented DAC).

In practice, non-linear effects may invalidate such assumption, which could further complicate the error prediction computation, necessitating a non-linear operation. However, it should be appreciated that various embodiments of the invention may be realized, which may include provisions for such effects at the cost of implementation complexity.

In a step 640, an appropriate portion of the Ns samples available are considered, representing a sufficient duration in what would be considered the signal's history prior to the sample being converted. This history will be used, as in a digital filter, to determine the residual error caused by each sample for the instance being considered. For example, if the toggling of the MSB is characterized to result in a particular sort of glitch during the calibration step, then this response is considered for every instance in the lookahead window where such toggling is anticipated, i.e. when transitioning between words where the value of the MSB changes. If the response associated with such transition is stored as a five-sample response, then two such responses may overlap if two such transitions take place within fewer than five clock cycles apart in time. Hence, the error predictor is capable of performing the summing operation that allows the dynamic effects from both these transitions to be considered, much like in a finite-impulse-response (FIR) or infinite-impulse-response (IIR) filter.

In a step 650, all the static contributors pertaining to the instance of interest and all the dynamic errors are added, which involves analyses of the history of samples prior to that instance, to yield a total instantaneous predicted error. This error is to be compensated for through the use of one or more of the three possible compensation means: digital amplitude, analog amplitude and time-domain manipulation. The digital amplitude correction involves the removal and/or addition of elements in the DAC/DACs 120, which requires the reconsideration of dynamic effects, since, by definition, the set of elements to be activated or deactivated will be affected by such correction. Contrarily, the analog amplitude correction, based on dedicated DAC 250, does not require such consideration, allowing simplification of the implementation of the computations related with the dynamic and static effects (i.e. will not require iterations).

It is to be noted that if the predicted error at any instance is relatively small, i.e. on the order of one step or LSB for the DAC 120, then the compensation DAC 250 may be designed, through the possible use of an attenuating network, to have a full scale that is on that order of magnitude. Hence, if DAC 250 were to accommodate, for example, four bits of resolution, corresponding to 16 steps, it could potentially serve to mitigate the predicted error in DAC 120 to about $1/16$ of the LSB of DAC 120, effectively increasing its resolution by four bits. Alternatively, as another example, it may be designed such that its 16 steps correspond to 2 steps in DAC 120, effectively increasing its resolution by only 3 bits (i.e. a factor of 8).

Finally, with the time-domain based compensation, the limitations in bandwidth and/or accuracy in the additional paths, such as the analog compensation path described above, are overcome. The digital compensation, based on manipulation of the timing and width of the clock pulses applied to the DAC/DACs 120, does not require wider bandwidths or high accuracies, and relies on relatively simple digital circuitry in which high timing accuracies can be achieved relatively easily.

In a step 650, the total error that may be corrected by the digital and analog amplitude compensation paths is determined, and the remaining error that is to be corrected through the use of time-domain manipulation of the DAC clock pulses is established. In step 660 the trend of the signal around the instance of interest is calculated, being a simple function of the difference between consecutive samples, and a corresponding time shift Δt is established for that sample, shifting its timing in a step 670. The method ends in an end step 680, after which a new cycle, starting in the step 610, will typically follow, unless the DAC is switched back into the calibration mode of operation.

Figure 7:
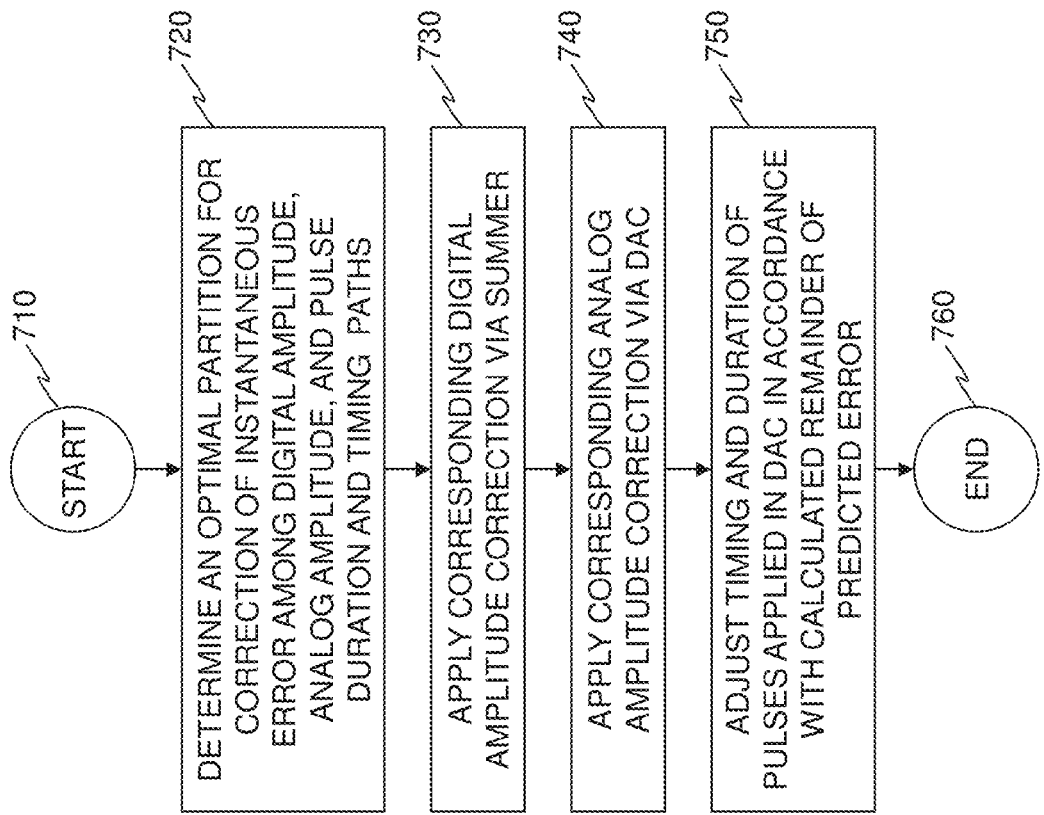
FIG. 7 is a flow diagram of one embodiment of a method of operating a self-compensated DAC.

The flow diagram of FIG. 7 describes one embodiment of a method of operating a self-compensated DAC. The method begins in a step 710. In step 720 the DSP 110 determines the optimal partition of the error correction among three different paths—digital amplitude correction, analog amplitude correction, and time domain manipulations (pulse duration and timing path). In Step 730 the appropriate digital error cancellation word −ϵ[k] 245 is applied. In step 740, which may occur simultaneously in a hardware based implementation, the necessarily analog correction −δ(t) 255 is applied via compensation DAC 250.

Finally, in a step 750, the appropriate timing manipulations are performed on the data applied to the array/arrays in DAC/DACs 120 to result in the attenuation, and possibly the cancellation, of the remaining error. The method ends in an end step 760.

Those skilled in the art to which this application relates will appreciate that other and further additions, deletions, substitutions and modifications may be made to the described embodiments.

What is claimed is:

1. A self-calibrating digital-to-analog converter (DAC), comprising:
   at least one DAC core operable to receive digital data words and clock pulses and produce an analog output having at least one impairment;
   an analog function block coupled to said at least one DAC core and operable to receive and make measurements of said at least one impairment;
   an analog-to-digital converter (ADC) coupled to said analog function block and operable to digitize said measurements during a calibration phase of operation of said self-calibrating DAC, said ADC operating at a sampling rate that is substantially lower than the DAC's clocking rate; and
   a digital controller coupled to said at least one DAC core and said ADC and operable to employ said measurements to adjust at least one of said digital data words and said clock pulses to mitigate the effects of said at least one impairment by adjusting either a timing, duration, or combination thereof, of said at least one of said clock pulses in accordance with at least a remainder of a predicted error.

2. The DAC as recited in claim 1 wherein said analog function block is operable to carry out one or both of:
   a linear filter function, and
   a non-linear function.

3. The DAC as recited in claim 1 wherein said digital controller is further configured to determine correction signals that are to be applied through digital and analog amplitude compensation paths and a remaining error to be corrected through use of time-domain manipulation of said clock pulses.

4. The DAC as recited in claim 1 wherein said digital controller is further operable to compensate by manipulating said digital data words and said clock pulses in the time domain.

5. The DAC as recited in claim 4 wherein said digital controller is further operable to adjust instances at which particular digital words are applied to a conversion element of said DAC.

6. The DAC as recited in claim 1 wherein said digital controller is further operable to compensate for said at least one impairment by applying controlled current/voltage-based corrections to said output.

7. The DAC as recited in claim 6 wherein said digital controller is further operable to adjust a duration of a pulse that determines how long a conversion element of said DAC would produce a certain corresponding current/voltage.

8. The DAC as recited in claim 1 wherein said digital controller is further operable to attenuate said at least one impairment by applying an inverted estimated error signal.

9. The DAC as recited in claim 8 wherein said digital controller is further operable to attenuate said at least one impairment by applying an inverted estimated error signal before combining time-domain manipulations.

10. The DAC as recited in claim 1 wherein said DAC is a binary DAC.

11. The DAC as recited in claim 1 wherein said DAC is a segmented DAC.

12. The DAC as recited in claim 1 wherein said DAC is an interleaved DAC with identical branches.

13. The DAC as recited in claim 1 wherein said DAC is an interleaved DAC with different branches.

14. The DAC as recited in claim 1 wherein said DAC is part of a Data Over Cable System Interface Specification (DOCIS) head-end transmitter.

15. The DAC as recited in claim 1 wherein said DAC is part of a Multimedia Over Cable Alliance (MOCA) transmitter.

16. The DAC as recited in claim 1 wherein said DAC is part of a cognitive radio transceiver.

17. The DAC as recited in claim 1 wherein said DAC is part of one selected from the group consisting of:
   an instrument,
   a pulse-forming circuit for a radar, and
   a software-defined jammer.

18. The DAC as recited in claim 1 wherein said DAC is part of a network selected from the group consisting of:
   a 4G network,
   an LTE network, and
   a wireless LAN.

19. A method of calibrating a digital-to-analog converter (DAC), comprising:
   intermittently stimulating a tested element to an input of said DAC;
   operating said DAC to produce an output signal;
   using an analog-to-digital converter (ADC) operating at substantially lower sampling rates than the clocking rate of said DAC to determine amplitude errors in said output signal caused by a presence of said tested element;

using said ADC to determine amplitude errors in said output signal experienced during said intermittently stimulating of said tested element; and adjusting a determined pulse duration and determined timing in accordance with at least a remainder of a predicted error.

20. The method as recited in claim 19 further comprising storing said static amplitude errors and said dynamic amplitude errors in at least one table.

21. The method as recited in claim 19 further comprising periodically repeating said intermittently coupling, said operating, said using said ADC to determine said static amplitude errors and said using said ADC to determine said dynamic amplitude errors.

22. The method as recited in claim 19 further comprising recording a temperature of said DAC during said operating.

23. The method as recited in claim 22 further comprising:
storing said temperature with said static amplitude errors and said dynamic amplitude errors; and
employing said static amplitude errors and said dynamic amplitude errors when said DAC is subsequently operating at least proximate said temperature; and employing modified versions of said static amplitude errors and said dynamic amplitude errors that are calculated based on known or estimated temperature dependencies.

24. The method as recited in claim 19 further comprising producing an indication that said calibrating is complete.

25. A self-calibrating method for a digital-to-analog converter (DAC), comprising:
determining a partition for correction of instantaneous error among digital amplitude, analog amplitude and pulse duration and timing;
applying a corresponding digital amplitude correction via a digital summer;
applying a corresponding analog amplitude correction via a dedicated compensation DAC; and
adjusting said pulse duration and timing in accordance with at least a remainder of a predicted error.

26. The method as recited in claim 25 wherein said DAC is a binary DAC.

27. The method as recited in claim 25 wherein said DAC is a segmented DAC.

28. The method as recited in claim 25 wherein said DAC is an interleaved DAC with identical branches.

29. The method as recited in claim 25 wherein said DAC is an interleaved DAC with different branches.

30. The method as recited in claim 25 wherein said partition is an optimized to minimize the resultant error.

* * * * *